(12) United States Patent
Tuttle

(10) Patent No.: US 6,478,909 B1
(45) Date of Patent: *Nov. 12, 2002

(54) METHOD FOR SURFACE MOUNTING ELECTRICAL COMPONENTS TO A SUBSTRATE

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/545,975

(22) Filed: Apr. 10, 2000

Related U.S. Application Data

(63) Continuation of application No. 09/133,275, filed on Aug. 12, 1998, now Pat. No. 6,048,420, which is a continuation of application No. 08/805,561, filed on Feb. 25, 1997, now Pat. No. 5,820,716, which is a continuation of application No. 08/538,826, filed on Oct. 5, 1995, now abandoned, which is a continuation of application No. 08/147,495, on Nov. 5, 1993, now abandoned.

(51) Int. Cl.⁷ .............................................. B32B 31/00
(52) U.S. Cl. ..................... 156/85; 29/832; 156/273.7; 156/315; 361/734; 361/746; 361/803
(58) Field of Search ..................... 156/315, 85, 273.7; 29/832; 361/803, 746, 734

(56) References Cited

U.S. PATENT DOCUMENTS

| | | | |
|---|---|---|---|
| 3,818,279 A | 6/1974 | Seeger, Jr. et al. | |
| 4,339,785 A | 7/1982 | Ohsawa | |
| 4,588,456 A | 5/1986 | Dery et al. | |
| 4,635,354 A | 1/1987 | Chrobak et al. | |
| 4,666,547 A | 5/1987 | Snowden, Jr. et al. | |
| 4,774,634 A | 9/1988 | Tate et al. | |
| 4,954,197 A | * 9/1990 | Jedlicka et al. | 156/273.7 |
| 5,084,123 A | * 1/1992 | Curtis | 156/85 |
| 5,210,938 A | 5/1993 | Hirai | |
| 5,258,577 A | 11/1993 | Clements | |
| 5,359,768 A | * 11/1994 | Haley | 29/832 |
| 5,820,716 A | * 10/1998 | Tuttle | 156/85 |
| 6,048,420 A | 4/2000 | Tuttle | |
| 6,144,558 A | * 11/2000 | Shiota et al. | 29/832 |

FOREIGN PATENT DOCUMENTS

JP          59-114726          7/1984

* cited by examiner

*Primary Examiner*—John J. Gallagher
(74) *Attorney, Agent, or Firm*—Wells St. John P.S.

(57) ABSTRACT

A method for surface mounting electrical components to a substrate, such as a printed circuitboard, involves use of an anisotropically conductive adhesive or Z-Axis adhesive between facing conductive surface areas on the component and substrate. Pressure is applied to the conductive adhesive by a nonconducting adhesive that is first cured between oppositely facing nonconductive surface areas of the component and substrate. This fixes the thickness of each layer of the conductive adhesive at a dimension no greater than its design conductive thickness. In a first submethod, the nonconducting adhesive is a fast setting adhesive subjected to mechanical pressure only as it is assembled on the substrate prior to the subsequent curing of the conductive adhesive. In a second submethod, it is a high shrinkage adhesive that applies compressive force between the component and substrate as it cures and shrinks dimensionally while at a temperature below the subsequent curing temperature of the conductive adhesive.

17 Claims, 1 Drawing Sheet

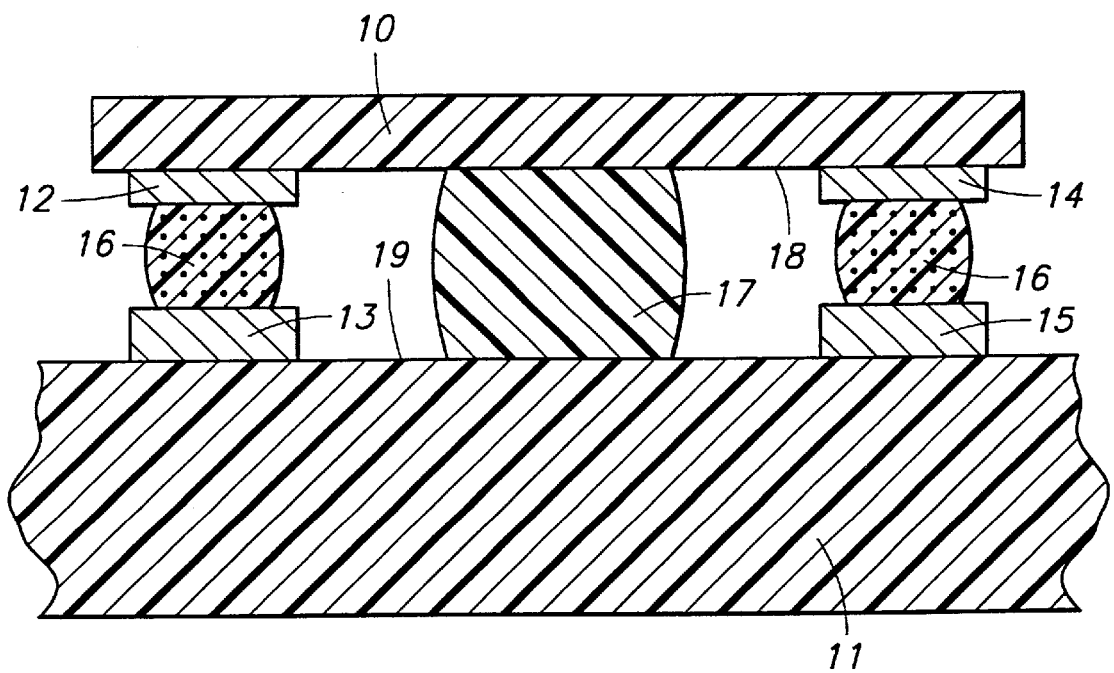

METHOD FOR SURFACE MOUNTING ELECTRICAL COMPONENTS TO A SUBSTRATE

RELATED PATENT DATA

This patent resulted from a continuation application of U.S. patent application Ser. No. 09/133,275, filed on Aug. 12, 1998, now U.S. Pat. No. 6,048,420, which was a continuation application of U.S. patent application Ser. No. 08/805,561, filed on Feb. 25, 1997, now U.S. Pat. No. 5,820,716, which was a continuation application of U.S. patent application Ser. No. 08/538,826, filed Oct. 5, 1995, now abandoned, which was a continuation application of U.S. patent Ser. No. 08/147,495, filed Nov. 5, 1993, now abandoned.

TECHNICAL FIELD

This disclosure pertains to methods for surface mounting electrical components to a substrate by use of directionally conductive adhesives.

BACKGROUND OF THE INVENTION

Adhesive surface mounting of devices to a supporting substrate is exemplified by the disclosure of U.S. Pat. No. 3,818,279 to Seeger, Jr. et al. It discloses use of a conductive elastomeric material containing electrically conductive particles for establishing random conductive paths between a substrate area and an overlying device. Such adhesives have no directionally conductive properties.

U.S. Pat. No. 4,339,785 discloses the mounting of a component to a printed circuit board by use of a structural adhesive.

U.S. Pat. No. 4,774,634 to Tate et al., discloses use of a structural adhesive connecting to the body of a device and used in combination with a flexible conductive adhesive at electrical contact areas. This combination produces a conductive connection between the leads of a circuit component and a supporting substrate, but the connection is again multidirectional.

The need to confine the area of conductivity when surface mounting a component by use of a conductive adhesive has led to development of anisotropically conductive adhesives, also known as Z-axis adhesives. Anisotropically conductive adhesives are a mixture of a nonconductive adhesive binder and conductive particles capable of forming electrically conductive paths between facing conductive surface areas when subjected to heat and pressure. By delineating the opposed areas at which pressure is exerted on such an adhesive, one can eliminate stray and unwanted conductive paths outside that area, where the conductive particles will be sufficiently separated from each other so that current will not flow through the composite mass. This eliminates the flow of current between adjacent conductive areas on the same substrate and between facing conductive surfaces separated by a distance greater than the minimal distance required to complete an electrical path through the adhesive mixture.

Surface mounting of components by use of an anisotropically conductive adhesive currently requires application of pressure during the course of setting or curing the adhesive. This typically requires usage of mechanical fixtures that must remain in place as the component and substrate are heated within an oven. Present use of such adhesives also requires redesign of the mechanical fixtures as any component features within a circuit are changed by subsequent developments.

The present invention has been developed to take advantage of the ability to apply conductive adhesive by screen printing or other types of printing technology. The use of printing technology to create electrical connections between components and a substrate is very rapid and economical. The inventive method also provides a high degree of flexibility for meeting changing circuit requirements, eliminating the necessity of redesigning mechanical fixtures to hold the circuit components in place as the conductive adhesive is being set.

BRIEF DESCRIPTION OF THE DRAWINGS

Preferred embodiments of the invention are described below with reference to the accompanying drawings, which are briefly described below.

The drawing is a schematic cross-sectional view illustrating the mounting of an electrical component on a supporting substrate.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present method is schematically illustrated by the accompanying drawing. It can be utilized for surface mounting an overlying electrical component 10 to a supporting substrate 11. The component 10 and substrate 11 have oppositely facing surfaces that include corresponding conductive surface areas 12, 13 and 14, 15, respectively. The paired corresponding conductive surface areas establish electrically conductive paths between the component 10 and substrate 11.

A layer of (anisotropically conductive adhesive) 16 is applied to at least one surface in each of the paired conductive surface areas 12, 13 and 14, 15. (Such an adhesive includes a mixture of a nonconductive adhesive binder and electrically conductive particles.) The conductive particles within the adhesive are capable of forming electrically conductive paths between the surface areas 12, 13 and 14, 15 when subjected to heat and pressure to reduce the layer thickness to an operable conductive dimension. This thickness dimension is a function of the conductive particle sizes within the composite adhesive mass.

Anisotropically conductive adhesives, also known as Z-axis adhesives, are well known in surface mounting technology for electronic components. A more comprehensive description of such compositions can be found within the disclosure of U.S. Pat. No. 4,588,456, which was issued May 13, 1986 and which is hereby incorporated into this disclosure by reference.

One specific example of an anisotropically conductive adhesive amenable to the practice of this new method is Zymet ZXUV 101, a Z-Axis epoxy adhesive manufactured by Zymet, Inc., of East Hanover, N.J. Other examples are ZME series Z-Axis epoxy adhesive paste and ZSP series Z-Axis epoxy adhesive paste, both manufactured by AI Technology, Inc. of Lawrenceville, N.J.

In place of the conventional step of mechanically applying pressure to the anisotropically conductive adhesive layers 16 by using mechanical fixtures or devices that must remain in place to exert pressure on the assembly as the adhesive is set by curing within an oven, the present invention utilizes a second adhesive to assure application of adequate curing pressure for the conductive adhesive. This second adhesive is a nonconductive adhesive 17 applied to at least one of the oppositely facing surfaces of the component 10 and substrate 11 at a location spaced from the conductive surface areas 12, 13 and 14, 15.

In the case of a symmetrical circuit component 10, adhesive 17 might be applied at its center, assuming that no conductive surfaces are at this location. Adhesive 17 might also be applied about multiple locations on a particular electrical component 10, depending upon its size and surface configuration.

The choice of adhesive 17 will be dependent upon the specific manner by which pressure is to be applied to the adhesive layers 16 during the time of curng.

The respective thicknesses of the adhesive layers should be such that the thickness of the applied anisotropically conductive adhesive layers 16 is only slightly greater than the operable conductive dimensions at which conductive paths are formed across their composite masses. After application of adhesive layers 16 and 17, the component 10 and substrate 11 are next assembled in their desired overlying positions relative to one another. The corresponding conductive surface areas 12, 13 and 14, 15 will then be in spatial registration with one another. At this point the anisotropically conductive adhesive will be in surface-to-surface contact with the corresponding conductive surface areas 12, 13 and 14, 15 and the nonconductive adhesive will be in surface-to-surface contact with oppositely facing nonconductive surfaces of component 10 and 11. Illustrative nonconductive surfaces are designated in the drawing by the reference numerals 18 and 19, respectively.

Curing of the adhesive layers 16 and 17 is a sequential two-step process. First, the nonconductive adhesive layer 17 is cured to bond the component 10 to the substrate 11 in a manner that subjects the anisotropically conductive adhesive to pressure as a result of the bonding forces applied to it by the set nonconductive adhesive. The assembling equipment for placing and/or holding component 10 on the substrate 11 can then be released. The anisotropically conductive adhesive is subsequently cured without further external curing pressure being applied to component 10. This results in bonding of the corresponding conductive surface areas 12, 13 and 14, 15 to one another, causing the conductive particles within the anisotropically conductive adhesive to form electrically conductive paths between the corresponding conductive surface areas as a result of the holding pressure of adhesive 17 while adhesive layers 16 are being cured. The pressure applied to the layers of adhesive 16 by action of the cured adhesive 17 reduces the thickness of the conductive adhesive to the operable conductive dimension at which conductive paths are completed through the particles within the adhesive composite during its curing process.

Two submethods for effectively setting the anisotropically conductive adhesive 16 under the curing pressure imparted by action of adhesive 17 have been identified to this point.

The first submethod involves use of a high shrinkage nonconductive adhesive that cures at an energy level or temperature substantially lower than that required to set or cure the anisotropically conductive adhesive. Conversely, the anisotropically conductive adhesive is curable at an energy level or temperature substantially greater than that required to cure the high shrinkage nonconductive adhesive. This submethod requires the component 10 to be placed on substrate 11 at a position wherein the thickness of adhesive layers 16 is not greater than the sum of its design conductive thickness plus expected shrinkage during the setting of adhesive 17. The shrinkage that occurs in the high shrinkage nonconductive adhesive will result in the exertion of compressive forces between the component 10 and substrate 11. These forces will pull the two elements toward one another and apply the required compression to the uncured anisotropically conductive adhesive layers 16 to reduce their thicknesses to the dimensions at which they form conductive paths. After the nbnconductive adhesive 17 has cured and shrunk, these compressive forces will remain intact as the assembly is further heated or subjected to radiation or other energy to set or cure the anisotropically conductive adhesive layers 16. Curing of adhesive layers 16 can be accomplished in the absence of external forces since the adhesive layers 16 will continue to be subjected to the pressure exerted by the previously-cured adhesive layer 17.

The second submethod involves use of a very fast setting nonconductive adhesive 17 to quickly bond the component 10 to the substrate 11 during the component placement step. The required curing pressure to achieve electrical contact through the particles within the anisotropically conductive layers 16 will be provided externally to the component 10 through conventional component placement equipment (not shown) that spatially locates the component 10 relative to substrate 11 at the design conductive thickness of adhesive layers 16. After the fast setting adhesive 17 has cured, this pressure will be maintained during subsequent curing of the anisotropically conductive adhesive layers 16 without any requirement of continuing external forces being applied to component 10.

A typical Z-axis epoxy adhesive, as identified previously, will cure at elevated temperatures of approximately 150 C. The identified Zymet adhesive requires a pressure of 0.5–1.0 Kgm/cm$^2$ during curing to obtain good electrical contact. The AI Technology adhesives specify application of 0.30 Kgm/cm$^2$ during curing at 150–160 C.

Such pressures can be achieved by use of the first-described submethod when utilizing a nonconductive adhesive 17 that shrinks approximately 4–12 percent as it is curing and that will set or cure at a temperature below that, necessary to set the anisotropically conductive adhesive layers 16. Adhesives that shrink approximately 4–12 percent as they are cured will exert adequate pressure to set and activate available anisotropically conductive adhesives in adjacent areas about rigid electronic components and substrates, such as a printed circuitboard. The anisotropically conductive adhesive may be in directly adjacent areas about such components and substrates. (Specific examples of such high shrinkage nonconductive adhesives that can be used in this process are Loctite 420 adhesive, manufactured by the Loctite Corporation, of Newington, Conn. and Pacer M5 adhesive, manufactured by Pacer Technology, of Rancho Cucamonga, Calif. Loctite 420 is a (cyanoacrylate adhesive) having) (10 percent shrinkage during curing, and cures at elevated temperatures below 150 C. Pacer M5 has similar properties.)

Examples of fast curing adhesives amenable to the second submethod are Loctite UV curable acrylics, produced by Loctite Corporation of Newington, Conn. and Emcast 1720 epoxy adhesives, manufactured by Electronic Materials, Inc. of New Milford, Conn. Both are cured in less than 10 seconds by application of ultraviolet radiation. They can be flashed with ultraviolet radiation while the component 10 is being held mechanically under pressure against the substrate 11 as the component 10 is placed on the substrate 11 and with the thicknesses of the layers of adhesive 16 at the operable conductive dimensions at which conductive paths are completed through the particles within the adhesive composite. The assembly can then be transferred to an oven to subsequently cure the anisotropically conductive adhesive layers 16 in the absence of further external pressure. The required pressure will be maintained on the layers of adhesive 16 as they are being cured by operation of the previously-cured second adhesive layer 17.

The nonconductive adhesive 17 will normally constitute a thermosetting adhesive that can be cured below the curing temperature of the anisotropically conductive adhesive layers 16. The nature and amount of energy utilized for setting the nonconductive adhesive will be dependent upon the specific choice of adhesive. Numerous adhesives are commercially available that meet the physical requirements of both described submethods.

The nonconductive adhesive might be cured by application of any compatible form of energy, including ultraviolet radiation or convective heat. Similarly, the anisotropically conductive adhesive, which is typically comprised of a thermoplastic binder, can be heated by any desired radiation or heat source, such as an oven. The details of curing both types of adhesives are well known and need not be further developed herein in order to enable those skilled in this field to practice the invention as described.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method for mounting an electrical component to a supporting substrate, comprising:
   providing an electrical component, the electrical component having a nonconductive surface and an adjacent conductive surface;
   providing a substrate, the substrate having a nonconductive surface and an adjacent conductive surface;
   applying an uncured nonconductive adhesive in contact with the nonconductive surfaces of the substrate and electrical component;
   applying an uncured anisotropically conductive adhesive in contact with the conductive surfaces of the substrate and electrical component;
   curing the nonconductive adhesive to bond the nonconductive surface of the substrate to the nonconductive surface of the electrical component;
   compressing the anisotropically conductive adhesive between the conductive surfaces of the substrate and electrical component and thereafter maintaining said compression entirely due to bonding forces generated by the nonconductive adhesive; and
   after curing the nonconductive adhesive, curing the compressed anisotropically conductive adhesive to form an electrically conductive path between the conductive surfaces of the substrate and electrical component.

2. The method of claim 1 wherein the nonconductive adhesive shrinks as it cures and wherein the compression is due to the shrinkage of the nonconductive adhesive.

3. The method of claim 1 wherein the nonconductive adhesive does not physically contact the conductive surfaces.

4. The method of claim 1 wherein curing the nonconductive adhesive comprises exposing the nonconductive adhesive to ultraviolet light, the method further comprising:
   during the curing of the nonconductive adhesive, the compressing comprising providing forces external to the bonding forces generated by the nonconductive adhesive to simultaneously compress the anisotropically conductive adhesive and the nonconductive adhesive; and
   prior to curing the compressed anisotropically conductive adhesive, removing said forces external to the bonding forces generated by the nonconductive adhesive.

5. The method of claim 1 wherein the electrical component nonconductive and conducive surfaces are directly adjacent one another and the substrate nonconductive and conductive surfaces are directly adjacent one another.

6. The method of claim 5 wherein the electrical component conductive surface comprises a plurality of conductive surfaces and the substrate conductive surface comprises a plurality of conductive surfaces.

7. A method for mounting an electrical component to a supporting substrate, comprising:
   providing an electrical component, the electrical component having a nonconductive surface and an adjacent conductive surface;
   providing a substrate, the substrate having a nonconductive surface and an adjacent conductive surface;
   applying a nonconductive adhesive in contact with the nonconductive surfaces of the substrate and electrical component, the nonconductive adhesive curing at a first temperature;
   applying an anisotropically conductive adhesive in contact with the conductive surfaces of the substrate and electrical component, the anisotropically conductive adhesive curing at a second temperature that is higher than the first temperature;
   curing the nonconductve adhesive at the first temperature to bond the nonconductive surface of the substrate to the nonconductive surface of the electrical component, the nonconductive adhesive shrinking as it cures, the anisotropically conductive adhesive being compressed between the conductive surfaces of the substrate and electrical component as the nonconductive adhesive shrinks; and
   after curing the nonconductive adhesive, curing the compressed anisotropically conductive adhesive at the second temperature to form an electrically conductive path between the conductive surfaces of the substrate and electrical component.

8. The method of claim 7 wherein the nonconductive adhesive shrinks by from 4% to 12% as it cures.

9. The method of claim 7 wherein the nonconductive adhesive does not physically contact the conductive surfaces.

10. The method of claim 7 wherein the electrical component nonconductive and conductive surfaces are directly adjacent one another and the substrate nonconductive and conductive surfaces are directly adjacent one another.

11. The method of claim 10 wherein the electrical component conductive surface comprises a plurality of conductive surfaces and the substrate conductive surface comprises a plurality of conductive surfaces.

12. A method for mounting an electrical component to a supporting substrate, comprising:
   providing an electrical component, the electrical component having a nonconductive surface and an adjacent conductive surface;
   providing a substrate, the substrate having a nonconductive surface and an adjacent conductive surface;

applying a nonconductive adhesive in contact with the nonconductive surfaces of the substrate and the electrical component, the nonconductive adhesive curing under first conditions;

applying an anisotropically conductive adhesive in contact with the conductive surfaces of the substrate and the electrical component, the anisotropically conductive adhesive curing under second conditions, but not curing under the first conditions;

curing the nonconductive adhesive under the first conditions to bond the nonconductive surface of the substrate to the nonconductive surface of the electrical component, the nonconductive adhesive being compressed between the nonconductive surfaces of the electrical component and the substrate by forces external to any bonding forces generated by the adhesive during the curing of the nonconductive adhesive, the anisotropically conductive adhesive being compressed between the conductive surfaces of the substrate and the electrical component by the external forces as the nonconductive adhesive cures;

after curing the nonconductive adhesive, removing the external forces; and after curing the nonconductive adhesive and removing the external forces, and while not providing external forces to further compress the anisotropically conductive adhesive, curing the compressed anisotropically conductive adhesive under the second conditions to form an electrically conductive path between the conductive surfaces of the substrate and electrical component.

13. The method of claim 12 wherein the first conditions comprise exposure to ultraviolet light.

14. The method of claim 12 wherein the electrical component nonconductive and conductive surfaces are directly adjacent one another and the substrate nonconductive and conductive surfaces are directly adjacent one another.

15. The method of claim 14 wherein the electrical component conductive surface comprises a plurality of conductive surfaces and the substrate conductive surface comprises a plurality of conductive surfaces.

16. A method for mounting an electrical component to a supporting substrate, comprising:

providing an electrical component, the electrical component having a nonconductive surface and a pair of conductive surfaces adjacent the nonconductive surface, the pair of conductive surfaces of the electrical component being a first conductive surface and a second conductive surface;

providing a substrate, the substrate having a nonconductive surface and a pair of conductive surfaces adjacent the nonconductive surface, the pair of conductive surfaces of the substrate being a third conductive surface and a fourth conductive surface;

applying a nonconductive adhesive in contact with the nonconductive surface of the substrate and in contact with the nonconductive surface of the electrical component, the nonconductive adhesive not being in contact with the first, second, third or fourth conductive surfaces, the nonconductive adhesive curing at a (first temperature;)

applying an anisotropically conductive adhesive in contact with the first conductive surface and in contact with the third conductive surface, the anisotropically conductive adhesive curing at a (second temperature,) the second temperature being higher than the first temperature;

applying the anisotropically conductive adhesive in contact with the second conductive surface and in contact with the fourth conductive surface;

curing the nonconductive adhesive at the first temperature to bond the nonconductive surface of the substrate to the nonconductive surface of the electrical component, the nonconductive adhesive shrinking as it cures, the anisotropically conductive adhesive being compressed between the first and third conductive surfaces and between the second and fourth conductive surfaces by the shrinking nonconductive adhesive; and after compressing the anisotropically conductive adhesive, curing the compressed anisotropically conductive adhesive at the second temperature to 1) form an electrically conductive path between the first and third conductive surfaces and bond the first conductive surface to the third conductive surface and 2) form an electrically conductive path between the second and fourth conductive surfaces and bond the second conductive surface to the fourth conductive surface.

17. A method for mounting an electrical component to a supporting substrate comprising the following steps:

providing an electrical component, the electrical component having a nonconductive surface and a pair of conductive surfaces adjacent the nonconductive surface, the pair of conductive surfaces of the electrical component being a first conductive surface and a second conductive surface;

providing a substrate, the substrate having a nonconductive surface and a pair of conductive surfaces adjacent the nonconductive surface, the pair of conductive surfaces of the substrate being a third conductive surface and a fourth conductive surface;

applying a nonconductive adhesive in contact with the nonconductive surface of the substrate and in contact with the nonconductive surface of the electrical component, the nonconductive adhesive curing under (first conditions;)

applying an anisotropically conductive adhesive in contact with the first conductive surface and in contact with the third conductive surface, the anisotropically conductive adhesive curing under (second conditions,) but not curing under the first conditions;

applying the anisotropically conductive adhesive in contact with the second conductive surface and in contact with the fourth conductive surface;

curing the nonconductive adhesive under the first conditions to bond the nonconductive surface of the substrate to the nonconductive surface of the electrical component, the anisotropically conductive adhesive being compressed between the first and third conductive surfaces and between the second and fourth conductive surfaces as the nonconductive adhesive cures; and after curing the nonconductive adhesive and while not providing external mechanical forces to further compress the anisotropically conductive adhesive, curing the compressed anisotropically conductive adhesive under the second conditions to 1) form an electrically conductive path between the first and third conductive surfaces and bond the first conductive surface to the third conductive surface and 2) form an electrically conductive path between the second and fourth conductive surfaces and bond the second conductive surface to the fourth conductive surface.

* * * * *

UNITED STATES PATENT AND TRADEMARK OFFICE
CERTIFICATE OF CORRECTION

PATENT NO. : 6,478,909 B1
DATED : November 12, 2002
INVENTOR(S) : Mark E. Tuttle It is certified that error appears in the above-identified patent and that said Letters Patent is hereby corrected as shown below:

Column 2,
Line 36, replace "(anisotropically conductive adhesive)" with -- anisotropically conductive adhesive --.
Lines 38-40, delete the parenthesis before the word "Such" and after the word -- particles --.

Column 3,
Line 14, replace "curng" with -- curing --.

Column 4,
Line 8, replace "nbnconductive" with -- nonconductive --.
Line 47, delete the parenthesis before the word "Specific"
Line 52, replace the two sentences beginning at line 52 and ending at line 55:
"Loctite 420 is a (cyanoacrylate adhesive) having) (10 percent shrinkage during curing, and cures at elevated temperatures below 150 C. Pacer M5 has similar properties.)"
with -- Loctite 420 is a cyanoacrylate adhesive having 10 percent shrinkage during curing, and cures at elevated temperatures below 150 C. Pacer M5 has similar properties. --

Column 6,
Line 11, replace "conducive" with -- conductive --.

Column 7,
Line 60, replace "(first temperature;)" with -- first temperature; --.
Line 65, replace "(second temperature,)" with -- second temperature, --.

UNITED STATES PATENT AND TRADEMARK OFFICE
CERTIFICATE OF CORRECTION

PATENT NO. : 6,478,909 B1
DATED : November 12, 2002
INVENTOR(S) : Mark E. Tuttle It is certified that error appears in the above-identified patent and that said Letters Patent is hereby corrected as shown below:

<u>Column 8,</u>
Line 38, replace "(first condictions;)" with -- first conditions --.
Line 42, replace "(second conditions,)" with -- second conditions, --.

Signed and Sealed this

Sixth Day of May, 2003

JAMES E. ROGAN
*Director of the United States Patent and Trademark Office*